United States Patent
Suzuki et al.

(10) Patent No.: US 6,206,012 B1
(45) Date of Patent: *Mar. 27, 2001

(54) METHOD OF AVOIDING WALL PARTICLE CONTAMINATION IN DEPOSITING FILMS

(75) Inventors: Daisuke Suzuki; Kenichi Ono; Yasuki Morino, all of Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/199,049

(22) Filed: Nov. 24, 1998

(30) Foreign Application Priority Data

Jun. 17, 1998 (JP) .................................................. 10-169889

(51) Int. Cl.$^7$ ..................................................... C23C 16/00
(52) U.S. Cl. ........................... 134/1.3; 438/905; 427/569
(58) Field of Search .......................... 118/724; 156/345; 438/905; 134/1.1, 1.2, 1.3, 19; 427/569; 432/241

(56) References Cited

U.S. PATENT DOCUMENTS

| | | | |
|---|---|---|---|
| 5,027,746 | * 7/1991 | Frijlink | 118/724 |
| 5,273,588 | * 12/1993 | Foster et al. | 118/723 E |
| 5,366,585 | * 11/1994 | Robertson et al. | 156/345 |
| 5,833,754 | * 11/1998 | Ito et al. | 118/725 |
| 5,935,337 | * 8/1999 | Takeuchi et al. | 118/724 |
| 6,031,205 | * 2/2000 | Shimazu | 219/390 |

FOREIGN PATENT DOCUMENTS 4-123257   11/1992 (JP) .

* cited by examiner

Primary Examiner—Jeffrie R. Lund
Assistant Examiner—Sylvia R. MacArthur
(74) Attorney, Agent, or Firm—Leydig, Voit & Mayer, Ltd.

(57) ABSTRACT

A method of avoiding deposition of particles from a film deposited on a wall of a film deposition apparatus, onto a film deposited in the apparatus, the method including directly heating a wall of a reaction chamber, before placing a wafer on a susceptor in the reaction chamber, to at least a wall film peeling temperature at which a wall film does not peel from the wall; placing a wafer in the reaction chamber, heating the wafer, and depositing a film on the wafer without directly heating the wall; ending heating of the wafer after deposition of the film and directly heating the reaction wall of the reaction chamber to at least the wall film peeling temperature; and removing the wafer from the reaction while the wall of the reaction chamber is maintained at a temperature at least equal to the wall film peeling temperature.

3 Claims, 4 Drawing Sheets

METHOD OF AVOIDING WALL PARTICLE CONTAMINATION IN DEPOSITING FILMS

BACKGROUND OF THE INVENTION

1. Field of the Invention

The present invention generally relates to a Film Deposition apparatus and, more particularly, to a Film Deposition apparatus of a type utilizing the metal organic chemical vapor deposition (MOCVD) technique.

2. Description of the Prior Art

The Film Deposition apparatus of the kind referred to above, that is, the MOCVD-based Film Deposition apparatus is largely employed in the production of semiconductor lasers that can be utilized as a light source for an optical communication system and various information processing devices. With this MOCVD-based Film Deposition apparatus, a semiconductor film of a uniform thickness and a uniform composition can be formed substantially uniformly over a relatively large surface substrate by the thermal decomposition of gaseous materials which leads to crystal growth on the substrate.

The prior art MOCVD-based Film Deposition apparatus will now be discussed with particular reference to FIGS. 5 and 6. The prior art Film Deposition apparatus, generally identified by 30, comprises a chamber-defining structure 2c having a reaction chamber defined therein, a gas introducing unit 3 and a preparatory chamber 10. To form a semiconductor film on a semiconductor wafer within the MOCVD-based Film Deposition apparatus 30, a wafer carrier having at least one semiconductor wafer mounted thereon is placed inside the preparatory chamber 10 which is subsequently evacuated to a substantial vacuum. A gate 9 is thereafter opened to load the wafer carrier 5 into the reaction chamber so as to rest on a substrate susceptor 4 within the reaction chamber.

After the placement of the wafer carrier 5 on the substrate susceptor 4 within the reaction chamber, the wafer on the wafer carrier 5 is heated to a predetermined temperature by means of a wafer heater 8 while the temperature thereof is monitored by a thermocouple 6, and gaseous raw material is then introduced into the reaction chamber through the gas introducing unit 3 to effect a thermal decomposition of the raw material within the reaction chamber. By this thermal decomposition, the crystal growth is initiated to eventually form a semiconductor film on one surface of the wafer.

Specifically, when an InP film is desired to be on the semiconductor wafer, the wafer within the reaction chamber of the chamber-defining structure 2c is heated to a temperature generally within the range of 600 to 700° C. and a mixture of phosphine ($PH_3$) and trimethyindium (TMI) (($CH_3)_3$ In) as the gaseous raw material is introduced into the reaction chamber.

At this time, by the effect of heat from the heater 8, the wall of the chamber-defining structure 2c that defines the reaction chamber, as measured at an outer wall surface thereof by means of a thermocouple 13, is also heated to a temperature of about 350° C. and, therefore, a wall film 11 resulting from the thermal decomposition of the gaseous raw material tends to be deposited on an inner wall surface of the chamber-defining structure 2c.

After the formation of the desired semiconductor film on the wafer, the wafer heater 8 is deenergized to allow the temperature of the wafer to be lowered, followed by movement of the wafer carrier 5 from the reaction chamber into the preparatory chamber 10, thereby completing a cycle of Film Deposition. Deenergization of the wafer heater 8 is accompanied by lowering of the temperature at the wall of the chamber-defining structure 2c and, at the time the wafer carrier 5 is unloaded from the reaction chamber, the temperature at the wall of the chamber-defining structure generally attains about 40° C.

By repeating the Film Deposition cycle described above a number of times, films can be successively formed on a plurality of semiconductor wafers.

The above discussed prior art Film Deposition apparatus has a problem. Specifically, successive formation of the films on the plural wafers accompanying cyclic energization and deenergization of the wafer heater 8 causes the wall of the chamber-defining structure 2c to experience a thermal hysteresis of from 40° C. to 350° C. and then from 350° C. down to 40° C. When the wall temperature of the chamber-defining structure 2c (the temperature measured at the outer wall surface of the chamber-defining structure 2c) is about 40° C., that is, when the wafer carrier 5 carrying the semiconductor wafer is to be loaded into or unloaded from the reaction chamber, the wall film sticking to the inner wall surface is prone to peel off under the influence of the difference in coefficients of thermal expansion of the wall film 11 and the material forming the chamber-defining structure 2c.

The wall film peeling off from the inner wall surface of the chamber-defining structure 2c is generally in the form of particles which, when falling onto the wafer, will disturb the crystal growth, eventually resulting in a reduction in yield of the film-deposited wafers.

SUMMARY OF THE INVENTION

Accordingly, the present invention has been devised to eliminate the above discussed problem substantially and is intended to provide an improved Film Deposition apparatus which makes use of means for reducing the obnoxious particles which tend to show up at the time the wafer is loaded into or unloaded from the work chamber in the chamber-defining structure.

In order to accomplish this object, the present invention provides a Film Deposition apparatus which includes a chamber-defining structure having a reaction chamber defined therein, a substrate heater accommodated within the reaction chamber for heating a substrate to form a film on one surface of the substrate, and a temperature control means operable when the substrate heater is deenergized, to retain a wall of the chamber-defining structure at a temperature equal to or higher than a predetermined temperature to avoid peel-off of wall film deposited on an inner wall surface of the chamber-defining structure.

The predetermined temperature referred to above is preferably 80° C. and, more preferably within the range of 80 to 300° C.

According to the present invention, by maintaining the wall of the chamber-defining structure at the specific temperature, that is, a temperature equal to or higher than the predetermined temperature, the particle count, that is, the number of particles of the wall film peeled off from the inner wall surface of the chamber-defining structure can advantageously be reduced. This in turn brings about an additional advantage in that the cleaning cycle of the chamber-defining structure to clean off the wall film sticking to the inner wall surface of the chamber-defining structure can be shortened.

Preferably, the temperature control means may be conveniently employed in the form of an electric wire heater externally mounted around the wall of the chamber-defining structure to thereby increase the workability of the apparatus.

If desired, the chamber-defining structure may be made of quartz and may include a fluid jacket formed in the wall of the chamber-defining structure. The fluid jacket contains a fluid medium having a boiling point higher than the predetermined temperature, and in this case, the temperature control means may comprise a fluid circulating means for circulating the fluid medium within the fluid jacket.

The fluid circulating means referred to above may include a fluid temperature control means for controlling the temperature of the homoiothermic fluid medium.

Where the chamber-defining structure is made of quartz, the temperature control means is preferably positioned so as to cover a portion of the wall of the chamber-defining structure that is encompassed by a space between a support member for supporting the substrate within the reaction chamber and a gas introducing unit fluid-coupled with the reaction chamber.

In any event, the present invention is effective not only to reduce the particle count, but also to increase the workability of the Film Deposition apparatus to thereby increase the yield of the film-deposited wafers.

BRIEF DESCRIPTION OF THE DRAWINGS

This and other objects and features of the present invention will readily be understood from the following description taken in conjunction with preferred embodiments thereof with reference to the accompanying drawings, in which like parts are designated by like reference numerals throughout several views thereof and in which.

DESCRIPTION OF THE EMBODIMENTS

Figure 1:
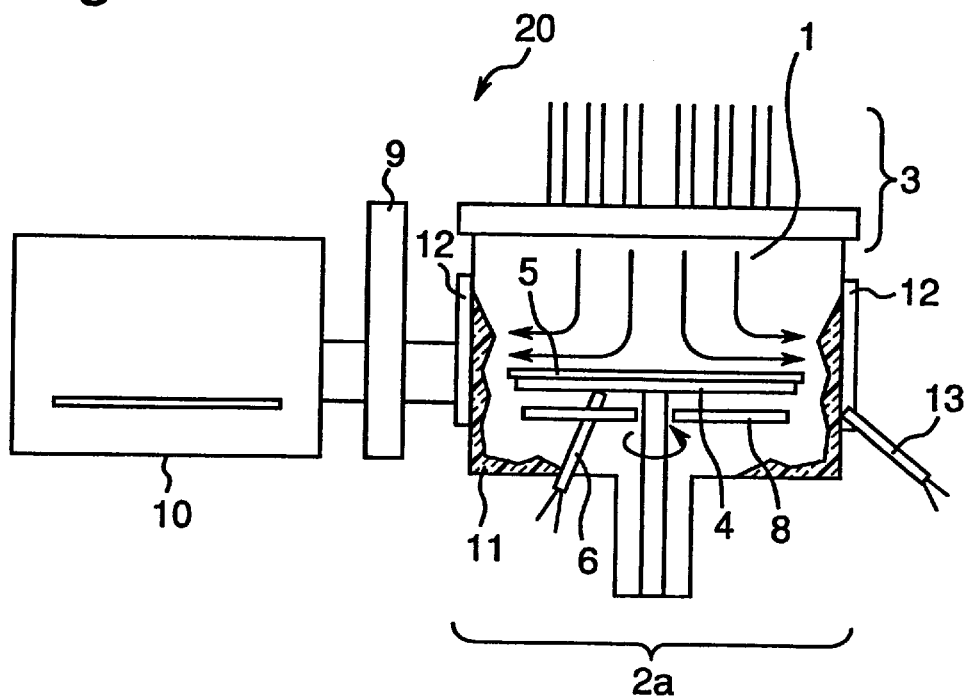
FIG. 1 is a schematic side sectional representation of an MOCVD-based Film Deposition apparatus according to a first preferred embodiment of the present invention.

Referring first to FIG. 1, a Film Deposition apparatus utilizing the MOCVD technique, that is, an MOCVD-based Film Deposition apparatus is generally identified by 20. This MOCVD-based Film Deposition apparatus 20 includes a chamber-defining structure 2a having a reaction chamber 1 defined therein and made of stainless steel. The Film Deposition apparatus 20 also includes a gas introducing unit 3 fluid-coupled with top of the work chamber 2a, a wall heater 12 comprised of an electric heating wire for controlling the temperature of a wall of the chamber-defining structure 2a, and a preparatory chamber 10 communicating with the reaction chamber 1 by way of a gate 9. The reaction chamber 1 is where a thermal decomposition of one or a mixture of raw materials in a gaseous phase takes place and accommodates therein a substrate susceptor 4 fixedly installed therein for the support thereon of one or a batch of wafers 5.

The wall heater 12 is mounted on the outer wall surface of the chamber-defining structure 2a at a location below the gas introducing unit 3. More specifically, this wall heater 12 is so positioned as to cover a region ranging between a first portion of the outer wall surface of the chamber-defining structure 2a, that is substantially level with the substrate susceptor 4, and a second portion of the outer wall surface of the chamber-defining structure 2a at a level higher than the position of the first portion, that is, a portion of the outer wall surface of the chamber-defining structure 2a encompassing a space between the gas introducing unit 3 and the substrate susceptor 4.

Figure 5:
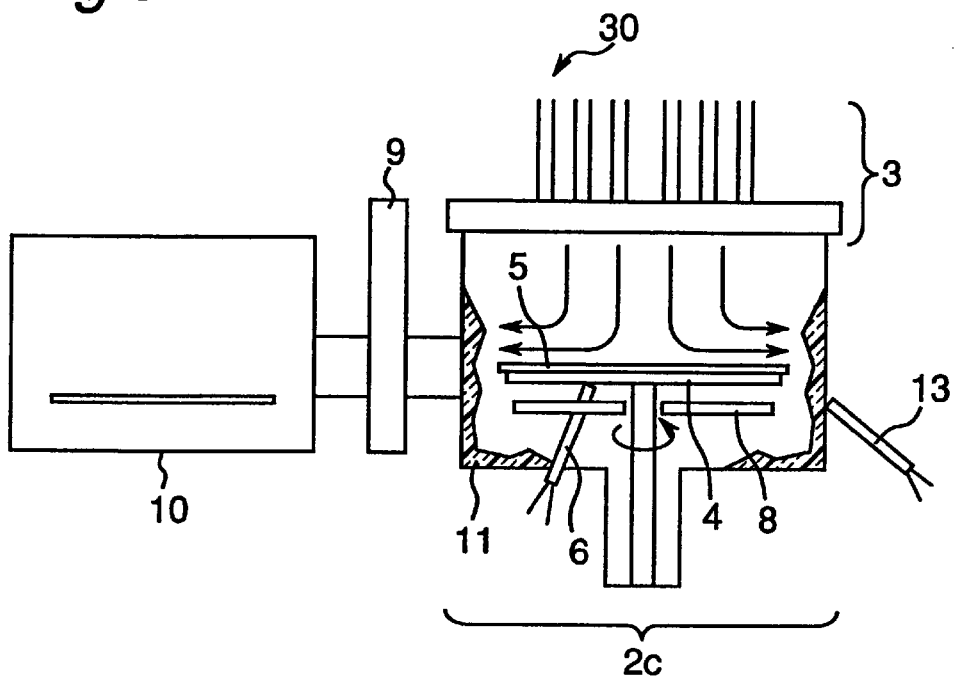
FIG. 5 is a schematic side sectional representation of the prior art MOCVD-based Film Deposition apparatus.
Figure 6:
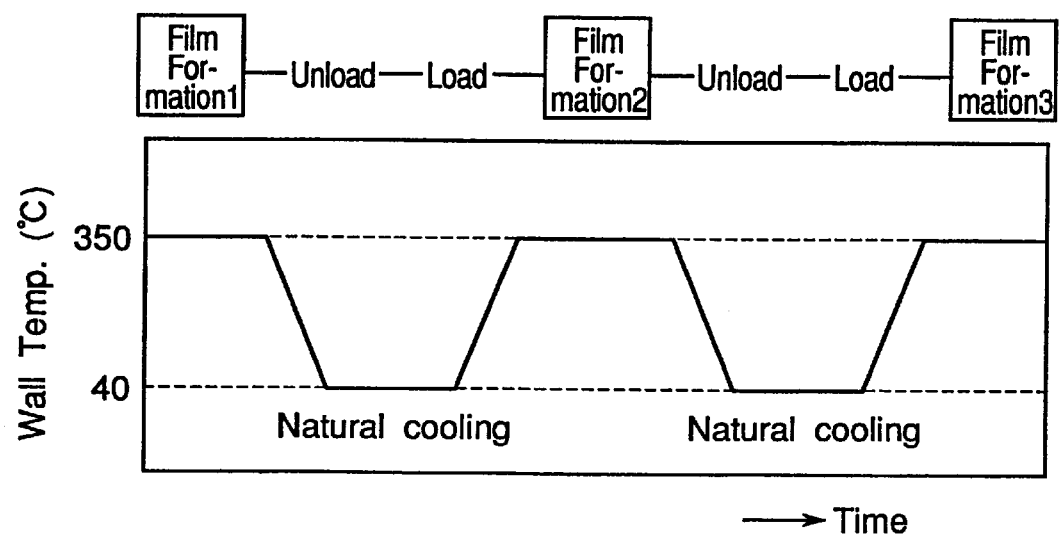
FIG. 6 is a graph showing a change in temperature at the outer wall surface of the prior art MOCVD-based Film Deposition apparatus, which was exhibited during the formation of the InP film on the wafer.

In any event, the details of the MOCVD-based Film Deposition apparatus 20 according to the embodiment shown in FIG. 1 may be substantially identical with the prior art MOCVD-based Film Deposition apparatus 30 shown in FIG. 5, except for the provision of the wall heater 12.

To form a semiconductor film on the semiconductor wafer within the MOCVD-based Film Deposition apparatus 20 of the structure described above, the wafer carrier 5 having the semiconductor wafer mounted thereon is placed inside the preparatory chamber 10 which is subsequently evacuated to a substantial vacuum. After the wall of the chamber-defining structure 2a has been heated by the wall heater 12 to a predetermined temperature equal to or higher than a wafer loading temperature, as defined later, a gate 9 is opened to load the wafer carrier 5 into the reaction chamber 1 so as to rest on the substrate susceptor 4 within the reaction chamber 1.

After the placement of the wafer carrier 5 on the substrate susceptor 4 within the reaction chamber 1, the wafer heater 8 is energized, in reference to a temperature reading given by the thermocouple 6 then measuring the temperature of the wafer, to heat the wafer to a predetermined working temperature, followed by introduction of the gaseous raw material from the gas introducing unit 3 into the reaction chamber 1 so the gaseous raw material undergoes thermal decomposition within the reaction chamber 1. As a result of the thermal decomposition, growth of crystals takes place on one surface of the wafer to eventually form a semiconductor thin film on the wafer.

The wafer loading temperature referred to above, as well as the wafer unloading temperature, as will be referred to later, or the wafer loading and unloading temperature as it is also employed in this specification, is intended to mean the temperature of the wall of the chamber-defining structure 2a, as measured at the outer wall surface by means of the thermocouple 13, that is effective to suppress any possible peeling of the unwanted wall film from the inner wall surface of the chamber-defining structure 2a confronting the reaction chamber 1.

After the formation of the desired semiconductor film on the wafer, the wafer heater 8 is deenergized to allow the temperature of the wafer to be lowered, followed by energization of the wall heater 12 to heat the wall of the chamber-defining structure 2a to or to be retained at a temperature equal to or higher than the wafer unloading temperature. The wafer carrier 5 is subsequently moved from the reaction chamber 1 and into the preparatory chamber 10, thereby completing a cycle of Film Deposition.

In order for the films to be successively deposited on the respective wafers, the Film Deposition cycle described above is repeated a number of times by loading and unloading the wafers, one for each cycle, while the temperature of the wall of the chamber-defining structure 2a that is heated by the wall heater 12 is controlled to be substantially equal to the above mentioned wafer loading and unloading temperature, that is, while the wall heater 12 is energized during deenergization of the wafer heater 8 to make the wall of the chamber-defining structure a temperature higher than the wafer loading and unloading temperature.

Since during deenergization of the wafer heater 8 the wall of the chamber-defining structure 2a is retained at a temperature substantially equal to or higher than the wafer loading and unloading temperature, any possible peeling-off of the wall film from the inner wall surface of the chamber-defining structure 2a can be suppressed, resulting in minimization of the number of particles produced by the wall film. Preferably, the wafer loading and unloading temperature is within the range of 80 to 300° C. in order to suppress formation of the particles from the inner wall surface of the wall of the chamber-defining structure 2a.

The MOCVD-based Film Deposition apparatus 21 according to a second preferred embodiment of the present invention will now be described with reference to FIG. 2. The Film Deposition apparatus 21 shown in FIG. 2 includes a chamber-defining structure 2b which in the illustrated embodiment is in the form of a quartz tube furnace, a fluid circulating means 16. As is the case with the Film Deposition apparatus 20 shown in FIG. 1, the Film Deposition apparatus 21 also includes the gas introducing unit 3, the substrate susceptor 4, the thermocouple 6, the gate 9 and the preparatory chamber 10. The fluid circulating means 16 includes a fluid temperature control means 15 and a fluid jacket 14 located externally to and around the chamber-defining structure 2b so as to enclose the latter and containing a liquid coolant having its temperature controlled by the fluid temperature control means 15. This liquid coolant circulates within the fluid jacket 14 to control the wall temperature of the chamber-defining structure 2b.

Figure 2:
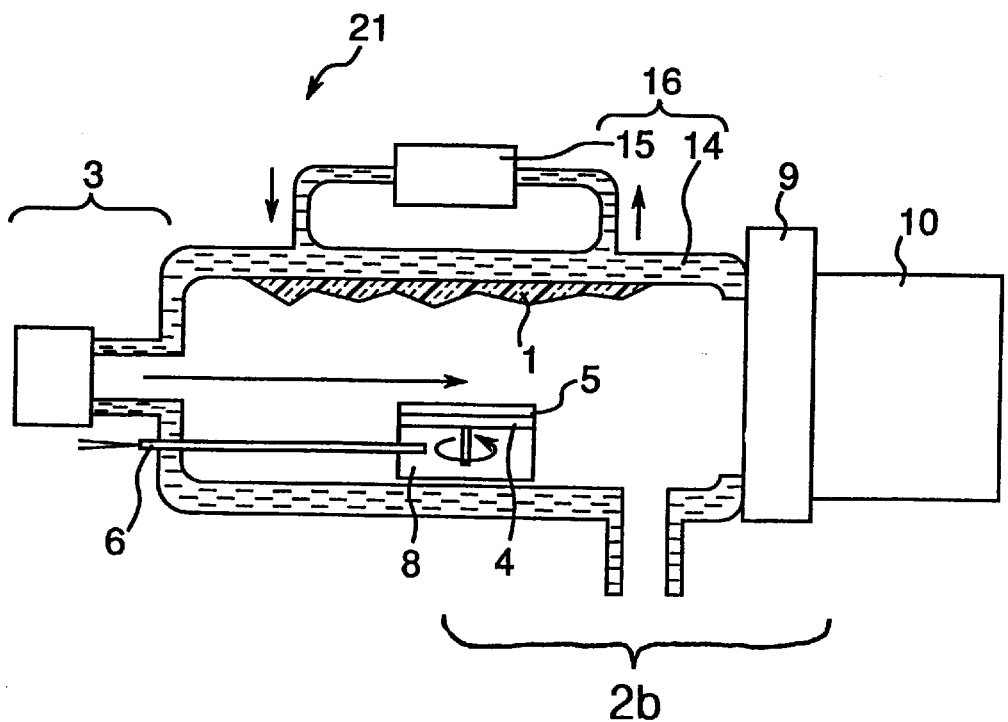
FIG. 2 is a schematic side sectional representation of an MOCVD-based Film Deposition apparatus according to a second preferred embodiment of the present invention.

The Film Deposition apparatus 21 shown in FIG. 2 can be operated in a manner substantially similar to the Film Deposition apparatus 20 shown in FIG. 1. Specifically, the cycle starting with loading of the wafer into the chamber-defining structure 2b, causing a crystal growth to form the semiconductor film on the wafer and unloading the film-deposited wafer from the chamber-defining structure 2b is repeated a number of times to provide plural film-deposited wafers. In order to retain the temperature of the wall of the chamber-defining structure 2b at a value equal to or higher than the wafer loading and unloading temperature during the loading or unloading of the wafer in each cycle, the liquid coolant, the temperature of which is controlled to a proper value by the fluid temperature control means 15, is circulated within the fluid jacket 14. In other words, during deenergization of the wafer heater 8, the fluid circulating means 16 operates to prevent the wall temperature of the chamber-defining structure 2b from lowering down to a value lower than the wafer loading and unloading temperature.

Since as is the case with the foregoing embodiment, the wall of the chamber-defining structure 2b is retained at a temperature substantially equal to or higher than the wafer loading and unloading temperature during deenergization of the wafer heater 8, any possible peeling-off of the wall film from the outer wall of the chamber-defining structure 2b can be suppressed, resulting in minimization of the number of particles produced by the wall film. Preferably, the wafer loading and unloading temperature that is employed in the practice of the second embodiment of the present invention is also within the range of 80 to 300° C. in order to suppress formation of the particles from the inner wall surface of the chamber-defining structure 2b. As a matter of course, the liquid coolant must be of a kind having a boiling point higher than 300° C., an example of which includes, for example, a fluorinated oil having a boiling point of about 350° C.

It is to be noted that while in the embodiment shown in FIG. 2 the fluid jacket 14 encloses the chamber-defining structure 2b substantially in its entirety, the fluid jacket 14 may be of a size sufficient to enclose a region of the chamber-defining structure 2b that is delimited between the gas introducing unit 3 and the substrate susceptor 4.

Hereinafter, the advantages of present invention will be demonstrated by way of comparative test results.

With the MOCVD-based Film Deposition apparatus 20 of the structure according to the first embodiment of the present invention shown in FIG. 1, experiments were conducted to deposit an InP film on each of a plurality of semiconductor wafers by the use of a gaseous mixture of $PH_3$ and $(CH_3)_3In$.

The wafer carrier having the semiconductor wafer mounted thereon was placed inside the preparatory chamber 10 which was subsequently evacuated to a substantial vacuum. After the wall of the chamber-defining structure 2a had been heated by the wall heater to about 100° C., the gate 9 was opened to load the wafer carrier 5 into the reaction chamber 1 so as to rest on the substrate susceptor 4 within the reaction chamber 1.

After the placement of the wafer carrier 5 on the substrate susceptor 4 within the reaction chamber 1, the wafer heater 8 was energized, in reference to a temperature reading given by the thermocouple 6 then measuring the temperature of the wafer, to heat the wafer to a working temperature of about 600 to 700° C., followed by introduction of the gaseous mixture from the gas introducing unit 3 into the reaction chamber 1 so the gaseous mixture underwent thermal decomposition within the reaction chamber 1. As a result of the thermal decomposition, crystal growth took place on the surface of the wafer to thereby form the InP film on the wafer. At this time, by the effect of the heat radiated from the wafer heater 8, the wall of the chamber-defining structure 2a was heated to about 350° C., which was measured by the thermocouple 13.

After the formation of the desired semiconductor film on the wafer, the wafer heater 8 was deenergized to allow the temperature of the wafer to be lowered, and on the other hand, the wall heater 12 was energized to heat the wall of the chamber-defining structure 2a to or to be retained at about 100° C. The wafer carrier 5 was then moved from the reaction chamber 1 and into the preparatory chamber 10, thereby completing a cycle of Film Deposition.

Figure 3:
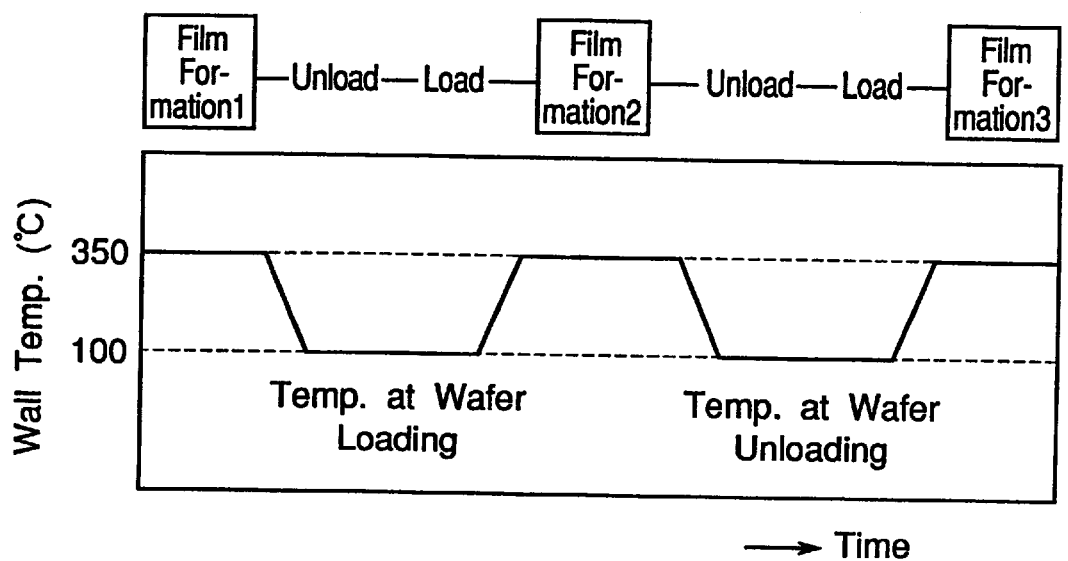
FIG. 3 is a graph showing a change in temperature at an outer wall surface of a chamber-defining structure in the Film Deposition apparatus of FIG. 1, which is exhibited when an InP film was formed on a wafer.

This Film Deposition cycle was repeated three times to provide wafers each having the InP film formed thereon due to the crystal growth within the reaction chamber. The wall temperature of the chamber-defining structure 2a changed as shown in the graph of FIG. 3 throughout the entire Film Deposition cycles.

Figure 4A:
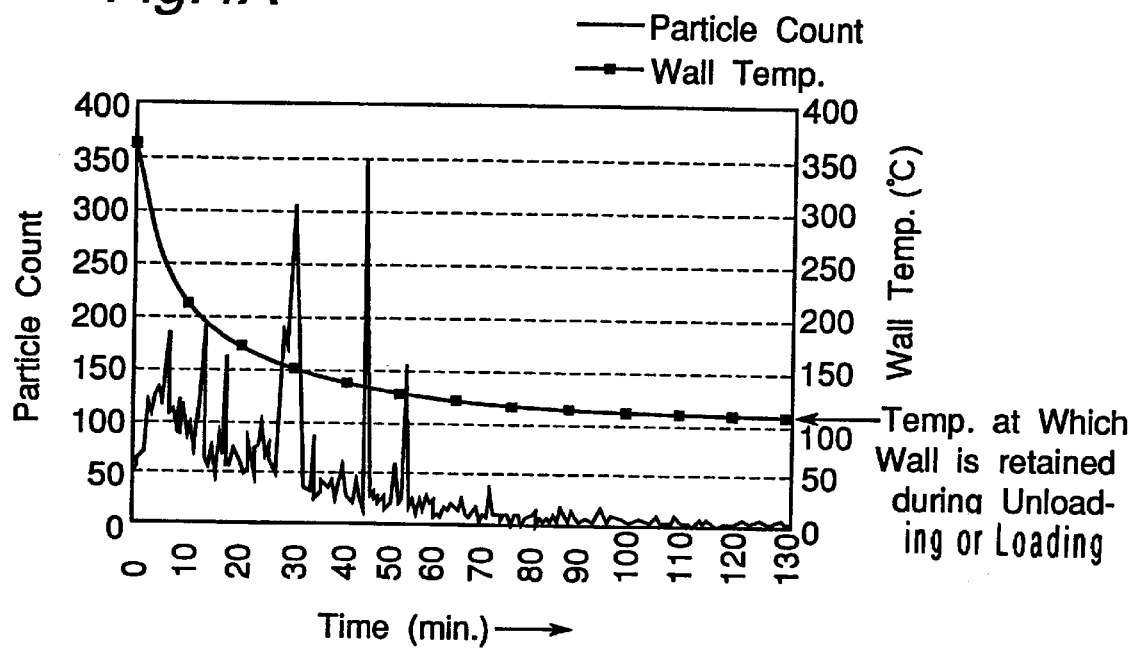
FIG. 4A is a graph showing a change in number of particles and that in temperature at the outer wall surface of the chamber-defining structure in the MOCVD-based Film Deposition apparatus of FIG. 1, with the passage of time subsequent to deenergization of a heater for heating the wafer during the InP Film Deposition process.

To measure the particle count, that is, the number of particles peeled off from the inner wall surface of the chamber-defining structure 2a, a particle counter was installed within a vent tube (not shown) fluid-connected with a bottom portion of the chamber-defining structure 2a. FIG. 4A illustrates the relation between the particle count measured by the particle counter and the wall temperature of the chamber-defining structure 2a with the passage of time subsequent to deenergization of the wafer heater 8.

Figure 4B:
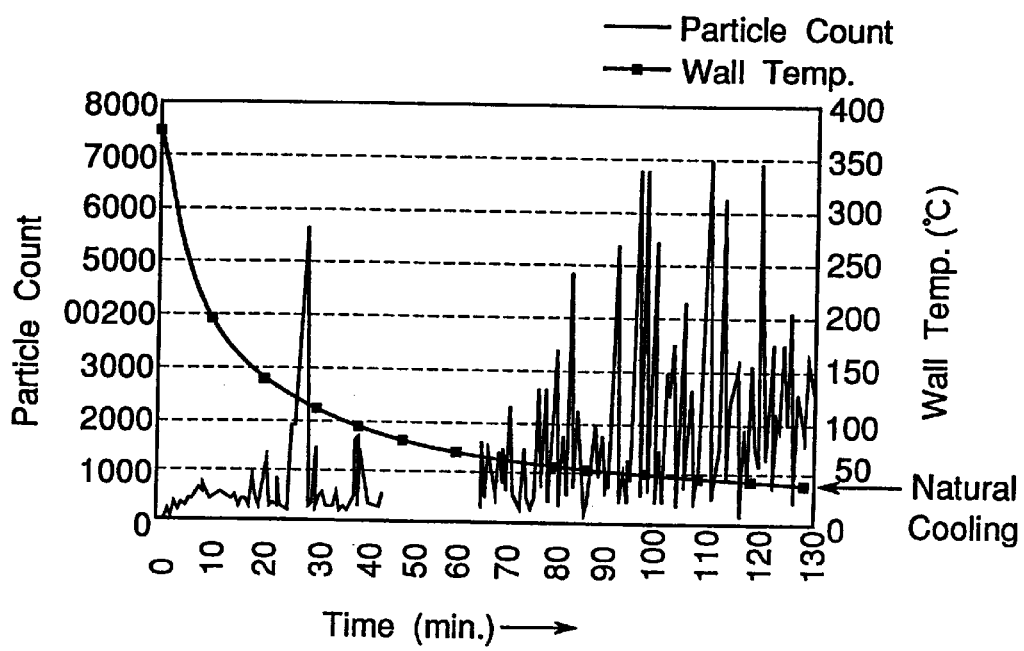
FIG. 4B is a graph showing a change in number of particles and that in temperature at the outer wall surface of the chamber-defining structure in the prior art MOCVD-based Film Deposition apparatus of FIG. 5, with the passage of time subsequent to deenergization of a heater for heating the wafer during the InP Film Deposition process.

For comparison purposes, similar experiments were conducted using the prior art MOCVD-based Film Deposition apparatus 30 shown in FIG. 5 to form the InP films on the wafers and the particle count was similarly measured in a manner substantially similar to that described above. FIG. 4B illustrates the relation between the particle count measured by the particle counter and the wall temperature of the chamber-defining structure 2c with the passage of time subsequent to deenergization of the wafer heater 8.

Comparison of the graph of FIG. 4A with that of FIG. 4B makes it clear that if the wall temperature of the chamber-defining structure is lower than 80° C., the particle count increases considerably, but this tendency does not occur if the wall of the chamber-defining structure is kept at a temperature higher than 100° C.

Thus, from the foregoing description, it has now become clear that the provision of the wall temperature control means in the MOCVD-based Film Deposition apparatus to heat the wall of the chamber-defining structure to and be retained at the wafer loading and unloading temperature during the loading or unloading of the wafer from or into the reaction chamber is effective to reduce the count of the particles which would be formed as a result of the wall film having been peeled off from the inner surface confronting the reaction chamber.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A method of avoiding deposition of particles from a film deposited on a wall of a film deposition apparatus, onto a film deposited in the apparatus, the method comprising:

directly heating a wall of a reaction chamber, before placing a wafer on a susceptor in the reaction chamber, to at least a wall film peeling temperature at which a wall film does not peel from the wall;

placing a wafer in the reaction chamber, heating the wafer, and depositing a film on the wafer without directly heating the wall;

ending heating of the wafer after deposition of the film and directly heating the reaction wall of the reaction chamber to at least the wall film peeling temperature; and removing the wafer from the reaction while the wall of the reaction chamber is maintained at a temperature at least equal to the wall film peeling temperature.

2. The method as claimed in claim 1, wherein the wall film peeling temperature is at least 80° C.

3. The method as claimed in claim 2 including heating the wall before placing a wafer on the susceptor and maintaining the wall while removing the wafer at a temperature in a range from 80° C. to 300° C.

* * * * *